Oct. 28, 1969 J. D. OLSON 3,475,284

MANUFACTURE OF ELECTRIC CIRCUIT MODULES

Filed April 18, 1966 2 Sheets-Sheet 1

JOHN D. OLSO
INVENTOR.

BY

ATTORNEY

MANUFACTURE OF ELECTRIC CIRCUIT MODULES

Filed April 18, 1966 2 Sheets-Sheet 2

United States Patent Office 3,475,284

Patented Oct. 28, 1969

3,475,284

MANUFACTURE OF ELECTRIC CIRCUIT MODULES

John D. Olson, Oakland, Calif., assignor to Friden, Inc., a corporation of Delaware Filed Apr. 18, 1966, Ser. No. 543,303

Int. Cl. C23b 5/48

U.S. Cl. 204—15 11 Claims

ABSTRACT OF THE DISCLOSURE

An insulating board, or the like, having conductors thereon and holes therethrough, some of which holes may pierce the conductors, is given an overall electroless, metal plate. Then electroplate resist, or ink, is applied to selected areas of the board, excluding the holes. The board is then electroplated to deposit metal through-connectors in the holes, the resist is removed, and the then-exposed electroless plate is also removed.

This invention relates to the manufacture of printed electric circuits.

This invention is especially advantageous for plating through-holes in circuit boards manufactured by the Marosi electrolytic deplating process described, for example, in U.S. Patent No. 3,239,441 dated Mar. 8, 1966, and British Patent No. 962,932, published July 8, 1964.

A circuit board, sometimes called a "printed circuit," includes an insulating board with conductors thereon, usually formed of foil and adhering to the board. Components, such as transistors, diodes, resistors, and capacitors, may be mounted on the board and connected to the foil conductors. One or more of such assembled boards may constitute a module.

According to one class of processes, electric circuit boards are manufactured from insulating sheets having copper foil stuck to both faces. Metal is removed from the areas that are to be nonconducting by chemical etching, or by electrolytic deplating as in the Marosi process. Holes are provided through the board for connections between conductors on opposite faces, and for the leads of components mounted on the board, such as resistors, capacitors and transistors. Such holes may be "plated through." In particular, it has been proposed that such holes be plated through before the metal is removed from the nonconducting areas for forming the conductors. Such "preplating" of the holes can be done without masking, or with a masking resist applied to the other areas of the board, but with both methods, the deposits in the holes are subject to damage by subsequent processing, and ridges of copper around the holes are likely to interfere with the removal of copper, particularly in the Marosi process. Although such ridges can be cut away by sanding, such an operation also grinds other areas and so leaves the board nonuniform.

Figure 1:
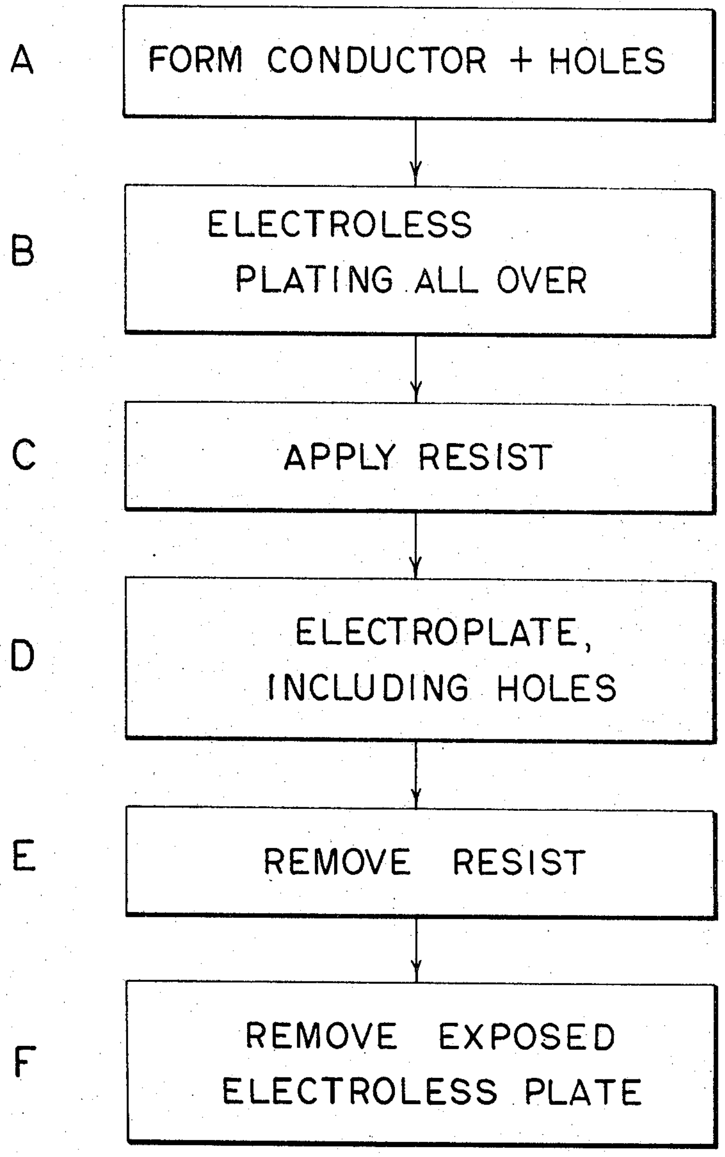

These and other advantages of the invention will be apparent from the following description of one specific process embodying the invention wherein:

FIG. 1 is a flow diagram of one process for carrying out my invention; and

FIGS. 2 to 6, inclusive, are sectional elevations of a circuit board at various steps of the process.

In carrying out the process of my invention, I may begin with laminated stock consisting of an insulating sheet, or base, such as an epoxy resin reinforced with glass fibers, having a continuous copper foil adhering to each face of the insulating sheet and process it according to the flow diagram of FIG. 1. Preferably, I first punch or drill all the holes that will be required in the finished board. Next, the board is run on the Marosi electrolytic deplating machine, such as is described in the patent already referred to. In this machine a master board having conductors in areas corresponding to those from which the metal is to be removed from the work, or circuit board, is held closely spaced from the work and serves as the cathode in an electrolytic circuit for removing metal from the work. Best results are obtained on the Marosi machine if the board, and particularly the copper foil, is of uniform character and thickness. It is one of the advantages of the present invention that I run the board on the Marosi machine before the board is subjected to any electroplating, or other chemical processing, and before the board is subjected to any mechanical operation, such as grinding, which could impair its uniformity.

Figure 2:
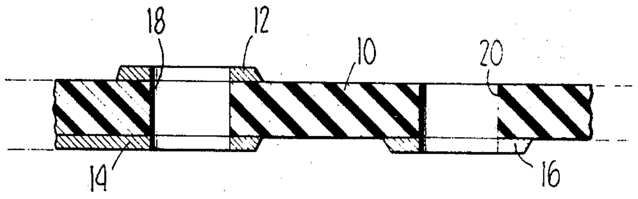

FIG. 2 shows a section through a circuit board at this stage of the process. The insulating base 10 has thereon conductors 12, 14 and 16, shown with exaggerated thickness, formed from the original laminate foil. Typically, these conductors will include annular portions, called "pads," surrounding the holes 18 and 20 through the board.

Next, the board is given a light immersion plating, or initial adherent conducting film, to prepare the surfaces of the insulating material for receiving an electroplated coating. For this initial conductive coat, I may use a proprietary process of the Shipley Company, Inc., of Wellesley, Mass., or a process described in the Shipley patent, No. 3,011,920. This Shipley process leaves a thin, somewhat transparent, coating of copper on all surfaces of the board, on both the plastic and the metal, including the interiors of the holes.

Figure 3:
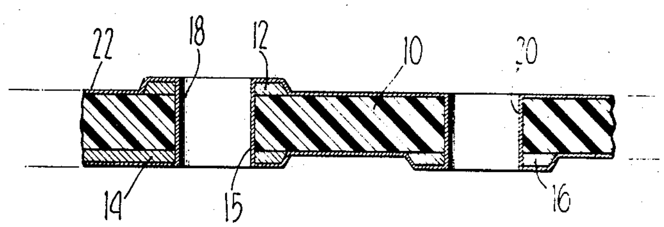
Figure 4:
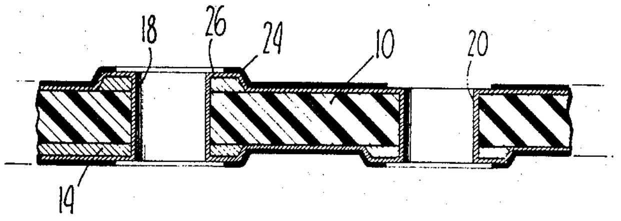

FIG. 3 shows the board with the electroless coat 22, covering the base 10, the conductors 12, 14 and 16, and the interior surfaces of the holes 18 and 20. Since this covers all surfaces, it electrically connects all the separate conductors 12, 14, 16, etc., on both faces of the board and also provides electric connection to the electroless film plating on the interiors of the holes. The thickness of the metal coating 22 is greatly exaggerated in the drawing.

Next, I apply a layer 24 (FIG. 4) of ink, or electroplating resist, to selected areas of the board. For example, this can be applied by printing, or can be applied through a stencil or a silk screen. All holes that are to be plated are kept free of the resist, and preferably each such hole is surrounded by an annular area 26, also free of resist, on each face of the board. The thickness of the resist 24 is exaggerated in the drawings.

Figure 5:
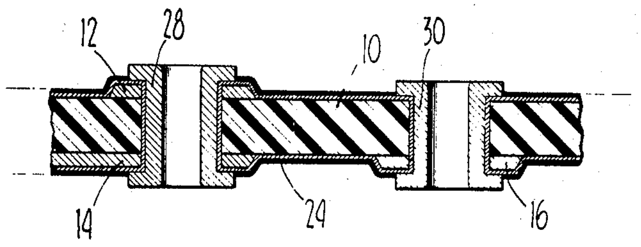
Figure 6:
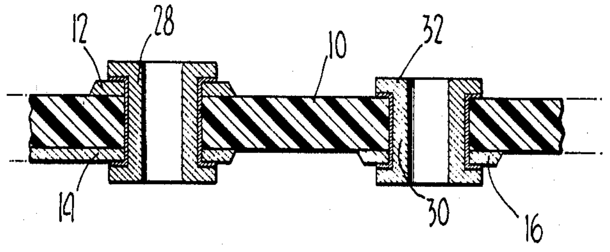

Next, the board is electroplated to deposit from .0005 to .002 inch of copper as eyelet-shaped connectors 28 and 30, shown with exaggerated thickness in FIG. 5. Next, the resist 24 is completely removed by means of a suitable solvent, such as trichloroethylene. Then the board is immersed quickly in an etching solution, such as ammonium persulfate, for removing the exposed portions of the electroless coat 22. The finished board then appears as in FIG. 6.

The plated connector 28 provides both a good, rivet-like electric connection between conductors, such as 12 and 14, on opposite surfaces of the board and also a good mechanical fastening. A connector, such as 30, through the hole 20 which connects to a conductor, such as 16, on only one side of the board, is intended for receiving the lead wire of a mounted element, such as a resistor.

The present process presents the laminated board in its best possible condition to the Marosi machine and so permits fast operation of that machine and the production of boards of a high and uniform quality. When the foil of the board going into the Marosi machine is nonuniform, the thick parts of the foil will be insufficiently deplated, whereas the thin parts will deplate excessively so as to leave the board unrepairable. When the holes are plated before the conductors are formed, the rims 32 cannot be left on the plated-through conductors 28 and 30. The present process, by forming the conductors 12, 14, etc., before the holes are plated, avoids the need for any sanding before the conductor formation, and avoids any exposure of the connectors 28, etc., to the eroding action of the conductor forming process. The thin, conducting, electroless coat 22, in connecting the conductors 12, 14, etc., provides a better electric connection to the hole portions of that coating than it would, for example, if the electroless coat were applied over a resist, such as the resist 24.

Although I prefer, as above described, to make the holes, such as 18 and 20 (FIG. 2) in the initial stock before forming the conductors, such as 12, 14 and 16, I may, alternatively, form the conductors first and then drill or punch the holes.

Although I prefer to keep the annular areas 26 (FIG. 4) clear of resist for inducing the formation of a well-formed rim, such as 32, on each through-hole connector 28 and 30, I may, alternatively, apply the resist with a roller, taking care to apply it only to the face and to leave clear the electroless-plated foil edge, such as 15 in FIG. 3, so that the electroplated connector can make a good bond thereto.

Although my process is of special advantage in the manufacture of circuit boards using the Marosi machine, it is also advantageous in the manufacture of circuit modules by other processes, as, for example, those using etching baths, because uniformity of the foil is necessary for uniform and consistent results in those processes too.

It will be apparent that my invention is capable of modification and variations within the scope of the claims.

I claim:

1. The steps in a method of making an electric circuit module or the like which comprise:

(a) forming circuit conductors on the surface of an insulating base, and forming holes in said base penetrating said conductors, (b) then depositing a conducting film, simultaneously and in a single step on said base, on said conductors, and in said holes, (c) then masking portions of the film-coated surface of said base and conductors, leaving the interior of at least certain of said holes unmasked; and (d) then plating metal onto unmasked portions of said film-coated surface including the unmasked interiors of said certain holes.

2. The method of claim 1 wherein there is included the step of:

(e) removing the conducting film from the masked portions.

3. The method of claim 1 wherein said conductors are formed on the surface of said insulating base by the selective removal of metal from a sheet of metal on said base.

4. The method of claim 1 wherein said conductors are formed on the surface of a board-like insulating base by selective electrolytic deplating of metal from a sheet of metal on said base.

5. The method of claim 1 wherein said holes are formed in said insulating base, and thereafter said conductors are formed on the surface of said base by selective electrolytic deplating of metal from a sheet of metal on said base.

6. The method of claim 1, wherein said conductors are formed on the surface of said insulating base by selective electrolytic deplating of metal from a sheet of metal on said base, and thereafter said holes are formed in said base.

7. The method of claim 1 wherein said conducting film is deposited by an electroless process from a plating bath.

8. The method of claim 1 wherein said base and conductors are masked by a plating resist applied thereto.

9. The method of claim 8 wherein annular rim areas on a planar face of the base and conductor surrounding said holes are kept free of said plating resist so that metal is plated as tubular connectors in said holes with rivet-like rims overlying said planar faces.

10. The method of claim 7 wherein said conducting film is copper, is substantially continuous, and is so thin as to be partially transparent.

11. The steps in a method of making an electric circuit module or the like which comprises (a) forming at least one hole through a localized area metal-coated insulating base to discrete circuit conductors formed on the surface of said base by electrolytically removing selected areas of the metal, (b) then forming an adherent conducting film, simultaneously and in a single step, over said base, said conductors and a wall of said at least one hole for providing an electric connection to said discrete conductors and for providing an initial conductive coating on said base between said conductors, (c) then coating portions of the film-coated surface of said base and conductors with an electroplating resist for masking said portions, (d) then electroplating metal connectors that are thick compared to said film onto unmasked portions of said film-coated surface, and (e) then removing said resist and conducting film from the masked portions of said base and conductors while leaving said connectors substantially intact.

References Cited

UNITED STATES PATENTS

| | | | |
|---|---|---|---|
| 2,699,424 | 1/1955 | Nieter | 204—15 |
| 3,208,921 | 9/1965 | Hill | 204—15 |
| 3,239,441 | 3/1966 | Marosi | 204—15 |

JOHN H. MACK, Primary Examiner

T. TUFARIELLO, Assistant Examiner